United States Patent
Rodriguez et al.

(10) Patent No.: US 6,470,483 B1
(45) Date of Patent: Oct. 22, 2002

(54) METHOD AND APPARATUS FOR MEASURING INTERNAL CLOCK SKEW

(75) Inventors: Pablo M. Rodriguez, Burlingame; Alper Ilkbahar, San Jose, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,443

(22) Filed: Dec. 30, 1999

(51) Int. Cl.[7] .............................................. G06F 17/50
(52) U.S. Cl. .................................. 716/6; 716/5; 716/4
(58) Field of Search ................................ 716/6, 5, 4, 1

(56) References Cited

U.S. PATENT DOCUMENTS

| | | | | |
|---|---|---|---|---|
| 5,381,416 A | * | 1/1995 | Vartti | 714/700 |
| 5,754,063 A | * | 5/1998 | Lee | 327/18 |
| 5,774,371 A | * | 6/1998 | Kawakami | 716/10 |
| 6,067,590 A | * | 5/2000 | Petty et al. | 710/100 |
| 6,166,572 A | * | 12/2000 | Yamaoka | 327/149 |

OTHER PUBLICATIONS

Moon et al, "Estimation and Removal of Clock Skew From Network Delay Measurements," IEEE, Mar. 99, pp. 227–234.*

* cited by examiner

Primary Examiner—Vuthe Siek
(74) Attorney, Agent, or Firm—Kenyon & Kenyon

(57) ABSTRACT

An integrated circuit for measuring internal clock skew is provided. The integrated circuit includes a first controlled delay module, which is operable to receive one of a sampling clock signal and a sampled clock signal. The integrated circuit further includes a first flip-flop having a first input coupled to the first controlled delay module and a second input coupled to one of the sampling clock signal and said sampled clock signal. The first flip-flop is operable to generate an output based on skew between the sampled clock signal and the sampling clock signal.

33 Claims, 9 Drawing Sheets

METHOD AND APPARATUS FOR MEASURING INTERNAL CLOCK SKEW

BACKGROUND OF THE INVENTION

1. Field of the Invention

The present invention relates generally to the testing of semiconductor chips. More particularly, the present invention relates to measuring internal clock skew to determine whether the clock skew is within a given specification.

2. Description of the Related Art

Digital circuits typically include digital components that operate in synchronism. In such systems, clocks are utilized to synchronize events between digital components such as flip-flops, multiplexers, adders, and multipliers. A clock generates a series of sequential square wave pulse signals that transition from a low state (i.e., logical "0") to a high state (i.e., logical "1"). The series of pulses, also known as a pulse train, is sent by the clock through conductive lines to each of the digital components to indicate when specific events must be performed.

Digital circuits are typically triggered by the "active" edge of a clock cycle. The active edge is typically the rising edge of the square wave pulse, although it may sometimes be on the falling edge of the pulse. A digital circuit usually requires its various components to be synchronized with active edges of the clock cycles to function properly. Therefore, it is intended that all clocks within the digital circuit are synchronized. However, factors such as the routing direction and the position of the clock source relative to the digital component may cause a delay. The difference in time between clock signal edges is known as clock skew. If a chip has an excessive clock skew (beyond a certain tolerance set by design specifications), the chip may fail.

To maximize what gets accomplished during every clock cycle, chips are designed with minimal margin of error. However, the margin of error must include the clock skew present in the chip. Because chip speeds continue to improve, the margin of error before chip failure is growing smaller and smaller. Therefore, clock skew continues to occupy an increasingly greater percentage of clock cycle time despite sophisticated clock distribution schemes to minimize clock skew. The clock skew problem is compounded by the need to generate and distribute multiple clocks, such as clocks used to operate the I/O, bus, and core logic in many digital systems.

Complex digital circuits must undergo extensive operability testing because the presence of even one defective gate or transistor may compromise the reliability or even the functionality of the chip. Therefore, chips must be tested to determine whether clock skew is within the limits set by the chip specification. The information is then used to identify defective parts during manufacturing sort and production testing. The measuring of clock skew is also useful during silicon "debug", and may shorten the time required to take the chip from first tape-out to high volume manufacturing.

One conventional method of measuring clock skew is known as tester probing, in which a production tester makes physical contact with the chip to test for various characteristics. However, production testers add significant economic cost (e.g., a tester may cost several million dollars) and production time to the chip manufacturing process. Furthermore, if additional tester pins are required, there may be appreciable extra cost as well, particularly because a larger integrated circuit package may be needed to accommodate the chip.

Another problem with production testers is that they cannot operate at the frequency of the fastest chips. The current maximum operating frequency for production testers is about 400 Mhz, while the fastest chips currently operate at about 800 Mhz. As chip complexity increases, it becomes more and more necessary to have built in self-test circuitry, such as a boundary scan chain system or JTAG (joint test action group, IEEEstd 1149.1), which uses scan registers to capture state from device input and output pins.

FIG. 1 is a block diagram of a boundary scan chain system 10 for testing a chip 11 as known in the art. Boundary scan chain system 10 includes a chip 11 that has a number of scan chain elements 12a–d that are coupled to a test clock (tclk). Data is entered serially into chip 11 from a data signal line 14 to scan chain element 12a on the active edge of the cycle of the tclk. The data is then shifted through the other scan chain elements 12b–d on each tclk pulse. Each scan chain element 12a–d performs a testing operation on the data. The data then exits chip 11 and boundary scan chain system 10 through data signal line 16. A detailed description of a boundary scan chain may be found in 1149.1-1990 Test Access Port and Boundary-Scan Architecture from The Institute of Electrical and Electronics Engineers (IEEE).

In view of the foregoing, it is desirable to have a method and apparatus for measuring internal clock skew within the boundary chain scan process to avoid the cost and production time associated with tester probing and having additional test pins.

SUMMARY OF THE INVENTION

According to an embodiment of the present invention, an integrated circuit for measuring internal clock skew is provided. The integrated circuit includes a first controlled delay module, which is operable to receive one of a sampling clock signal and a sampled clock signal. The integrated circuit further includes a first flip-flop having a first input coupled to the first controlled delay module and a second input coupled to one of the sampling clock signal and said sampled clock signal. The first flip-flop is operable to generate an output based on skew between the sampled clock signal and the sampling clock signal.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION

A method and apparatus for seamlessly measuring internal clock skew in an integrated circuit is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to necessarily obscure the present invention.

Figure 1:
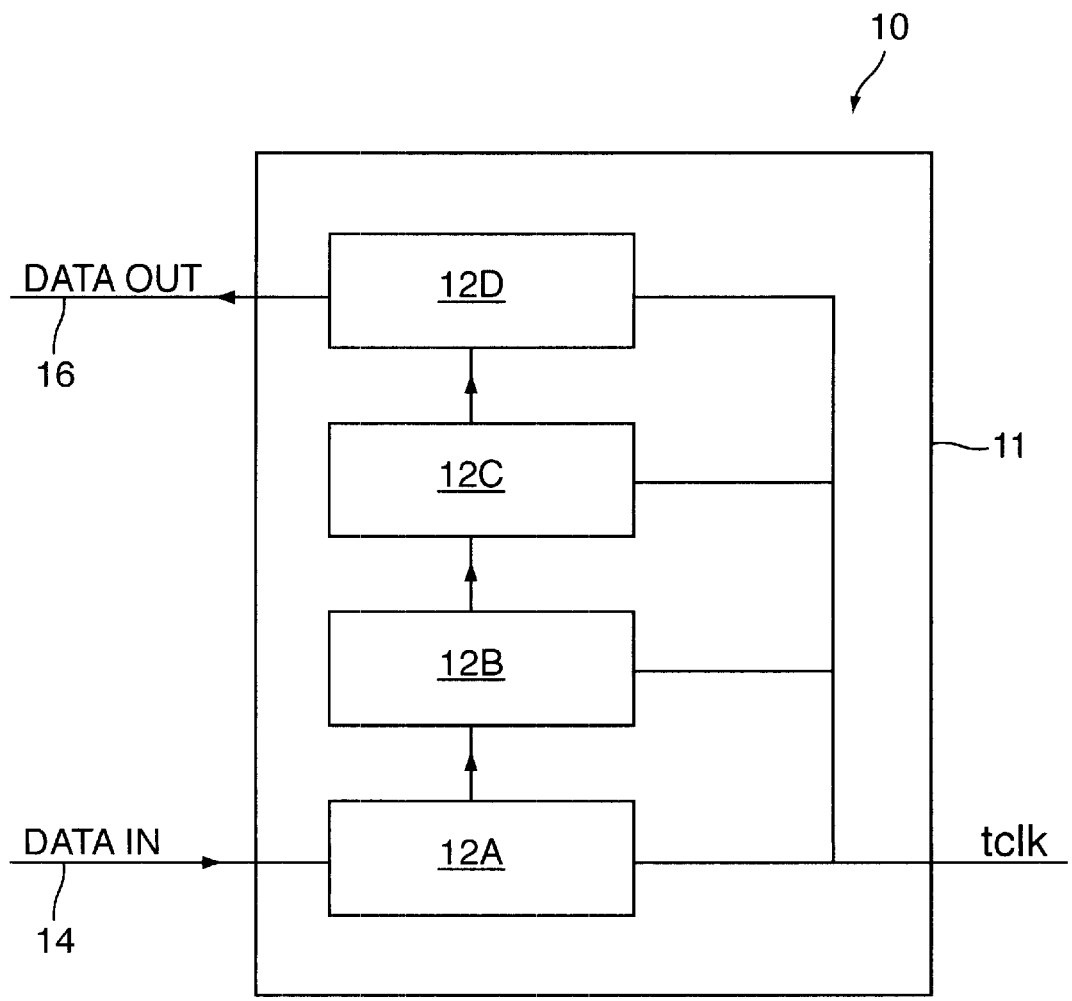
FIG. 1 is a block diagram of a boundary scan chain system for testing a chip as known in the art.

FIG. 1 is a block diagram of a boundary scan chain system 10 for testing a chip 11 as known in the art. Boundary scan chain system 10 includes a chip 11 that has a number of scan chain elements 12a–d that are coupled to a test clock (tclk). Data is entered serially into chip 11 from a data signal line 14 to scan chain element 12a on the active edge of the cycle of the tclk. The data is then shifted through the other scan chain elements 12b–d on each tclk pulse. Each scan chain element 12a–d performs a testing operation on the data. The data then exits chip 11 and boundary scan chain system 10 through data signal line 16. A detailed description of a boundary scan chain may be found in 1149.1-1990 Test Access Port and Boundary-Scan Architecture from The Institute of Electrical and Electronics Engineers (IEEE).

Figure 2A:
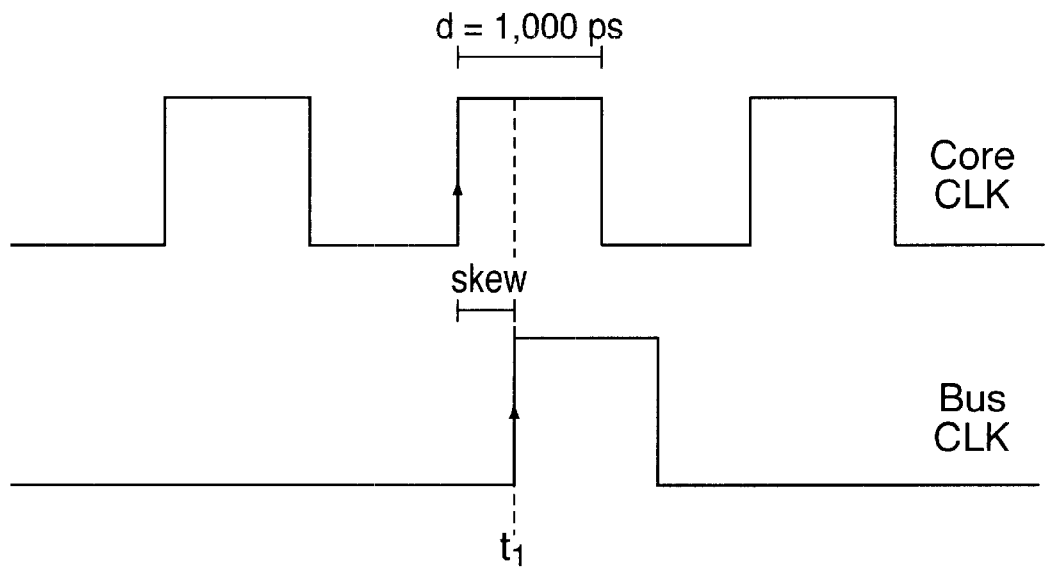
FIG. 2A is a timing diagram of a digital system with a sampled clock signal (core clk) and a sampling clock signal (bus clk).

FIG. 2A is a timing diagram of a digital system with a sampled clock signal and a sampling clock signal. While the sampled clock signal and the sampling clock signal are shown as a core clk and a bus clk, they may comprise of any two clocks that are related and have regular patterns. For exemplary purposes, the specification of this digital system provides that the duration d of the signal level (e.g. at a "1" level) of the core clk is 1,000 picoseconds (ps) and that the clock skew must be under 500 ps. While clock skew may not be directly measured without additional testing equipment, the value of core clk at time $t_1$, the rising edge of bus clk, may be sampled in a boundary scan chain. In this example, the value of core clk at the rising edge of bus clk is a "1".

Figure 2B:
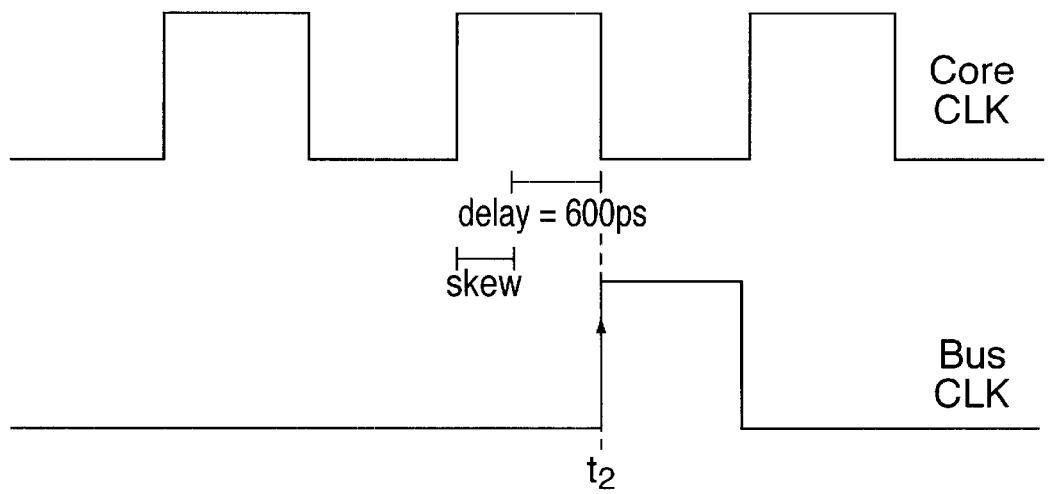
FIG. 2B is a timing diagram of the digital system referred to in FIG. 2A where delay has been added to the sampling clock signal in accordance with one embodiment of the present invention.

FIG. 2B is a timing diagram of the digital system referred to in FIG. 2A where delay has been added to the sampling clock signal in accordance with one embodiment of the present invention. To measure clock skew, delay may be added to one of the clock signals in small increments until a failure (when the value of core clk at the rising edge of bus clk is a "0") is sampled at time $t_2$. The clock skew between core clk and bus clk may then be calculated by comparing the amount of delay that results in failure and the duration of the "1" value for the core clk. In this particular example, the amount of delay required to detect a failure is 600 ps. Therefore, the clock skew is 400 ps, which is within the chip clock skew tolerance of 500 ps in this example.

Figure 3:
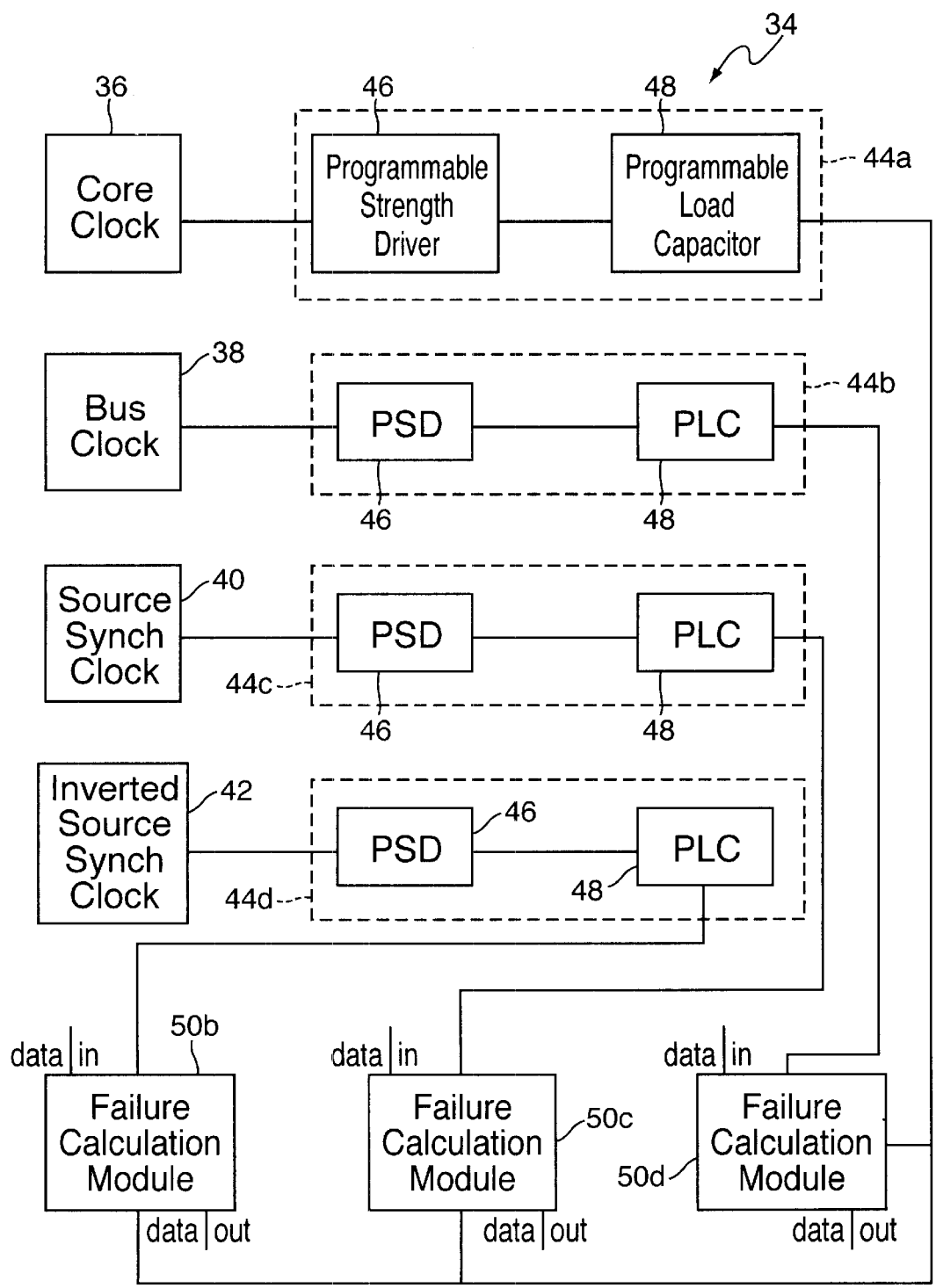
FIG. 3 is a block diagram of clock skew measuring circuit in accordance with one embodiment of the present invention.

FIG. 3 is a block diagram of clock skew measuring circuit 34 in accordance with one embodiment of the present invention. Clock skew measuring circuit 34 is coupled to inputs from a sampled clock and at least one sampling clock. In this exemplary diagram, a core clock 36 functions as the sampled clock and a bus clock 38, a source synchronous clock 40, and an inverted source synchronous clock 42 function as sampling clocks. Clocks 36, 38, 40, and 42 are each preferably coupled to a series of delay modules 44a–d, to provide control delay to each clock. However, clock skew may be determined as long as one of the sampled clock or all of the sampling clocks are subject to a controlled delay. For example, if core clock 36 is coupled to a delay module 44, then clocks 38, 40, and 42 do not need to be delayed.

Delay modules 44a–d preferably include a programmable strength driver 46 coupled to a programmable load capacitor 48, which are used to deliver a controlled amount of delay to each clock signal. While delay modules 44a–d are shown including only one programmable strength driver and one programmable load capacitor, it will be understood to one skilled in the art that more strength drivers and load capacitors may be utilized. Each delay module 44b–d is further coupled to a corresponding failure calculation module 50b–d, which is operable to determine a synchronization failure between two clock signals. Delay module 44a is coupled to all failure calculation modules 50b–d so that it may be determined whether there is a failure between the sampled clock and each sampling clock. Failure calculation modules 50b–d may also include data inputs and outputs to a boundary scan chain as described above with regard to FIG. 1.

Figure 4A:
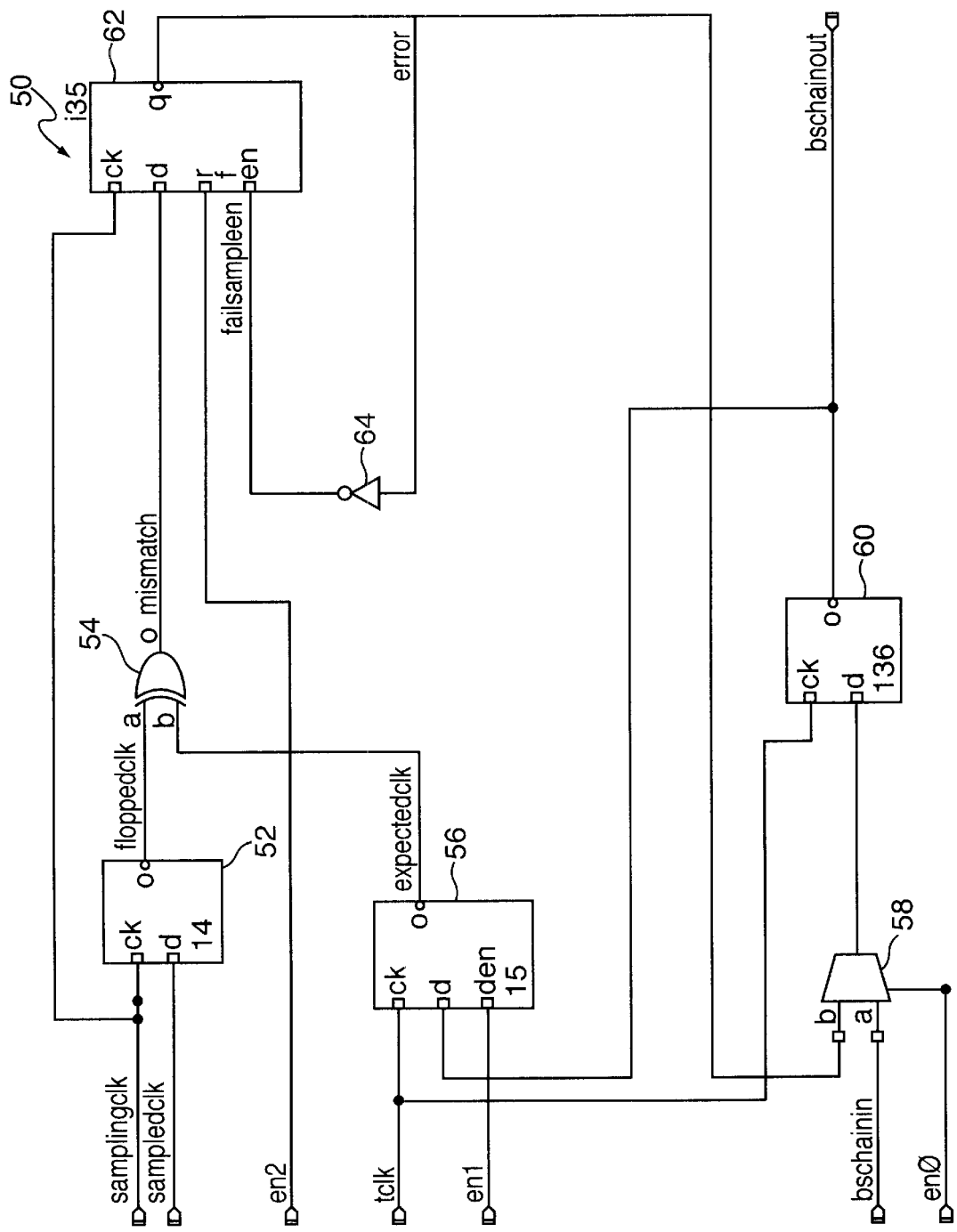
FIG. 4A is a circuit diagram of a failure calculation module in accordance with one embodiment of the present invention.

FIG. 4A is a circuit diagram of failure calculation module 50 in accordance with one embodiment of the present invention. Failure calculation module 50 includes a flip-flop 52. Flip-flop 52 is a D flip-flop, but as is well known in the art, other types of flip-flops or latches may be used to accomplish the same tasks. A sampling clock (samplingclk) signal is input into the clock input of flip-flop 52 and a sampled clock (sampledclk) signal is input into the D input of flip-flop 52. Either one or both of the clocks may be subject to a controlled delay. On the rising edge of samplingclk, flip-flop 52 latches sampledclk to generate an output signal (floppedclk). The value of floppedclk is determined by the value of sampledclk at the time samplingclk transitions from low (i.e., logical "0") to high (i.e., logical "1").

Floppedclk is then compared with an expected clock signal (expectedclk), the value of which preferably originates from an expected value input to a boundary scan chain and into failure calculation module 50. In this example, the expected value is determined by projecting the value of sampledclk at the rising edge of samplingclk in a system that is within the specification. In a system such as the one illustrated in FIG. 2A, the expected value is "1". However, if a system is designed so that the sampledclk transitions from "0" to "1" on the rising edge of the samplingclk, then the expected value would be "0". Floppedclk and expectedclk are preferably input into and compared by an exclusive or (XOR) gate 54, however it is understood to one skilled in the art that there are other methods of comparing the two signals.

When an enable signal (en0) is asserted (set to "1"), a boundary scan chain in signal (bschainin) containing the expected value is preferably selected by a multiplexer 58 and buffered. The expected value is then latched by flip-flop 60 on the rising edge of tclk. Tclk preferably allows clock skew measuring circuit 34 to be in synchronism with a semiconductor chip testing system such as a boundary scan chain illustrated in FIG. 1.

The expected value is then provided to the D input of a flip-flop 56 and a boundary scan chain output (bschainout).

Flip-flop 56 latches the expected value on the rising edge of tclk when an enable signal (en1) is asserted. When en1 is unasserted, flip-flop 56 is disabled and the output of flip-flop 56 is stabilized. Expectedclk is then input to XOR gate 54, which compares floppedclk and expectedclk. If floppedclk and expectedclk do not have the same value, then a failure has been detected and a mismatch signal (mismatch) with a value of "1" is output by XOR gate 54. If floppedclk and expectedclk have the same value, then no failure has been detected, and mismatch will have a value of "0".

Mismatch is then supplied to the D input of a flip-flop 62. An enable signal (en2) is supplied to a reset input of flip-flop 62. Therefore, when en2 is asserted, the output error signal (error) of flip-flop 62 will always be "0". Because error is routed to an enable input of flip-flop 62 through an inverter 64, flip-flop 62 will always be enabled when en2 is asserted. When en2 is unasserted, flip-flop 62 starts with an output of "0" and resumes normal operation. Mismatch is then latched on the rising edge of samplingclk.

If error is asserted, then inverter 64 will receive a value of "1". Inverter 64 will then output a fail sample enable signal (failsampleen) with a value of "0", which disables flip-flop 62. When flip-flop 62 is disabled, it will not latch any data, and therefore the output of flip-flop 62 becomes stable. In this manner, flip-flop 62 ensures that any error latched will be captured by failure calculation module 50. If error is not asserted, then flip-flop 62 will continue sampling mismatch on the rising edge of samplingclk until en2 goes to a "1" value.

The error signal is also supplied to an input of multiplexer 58. When en0 is unasserted, error is selected by multiplexer 58. The data in error is then latched by flip-flop 60 on the rising edge of tclk to the D input of flip-flop 56 and bschainout. The data in bschainout will eventually be output from the boundary scan chain and indicate whether or not a failure was detected by failure calculation module 50.

Figure 4B:
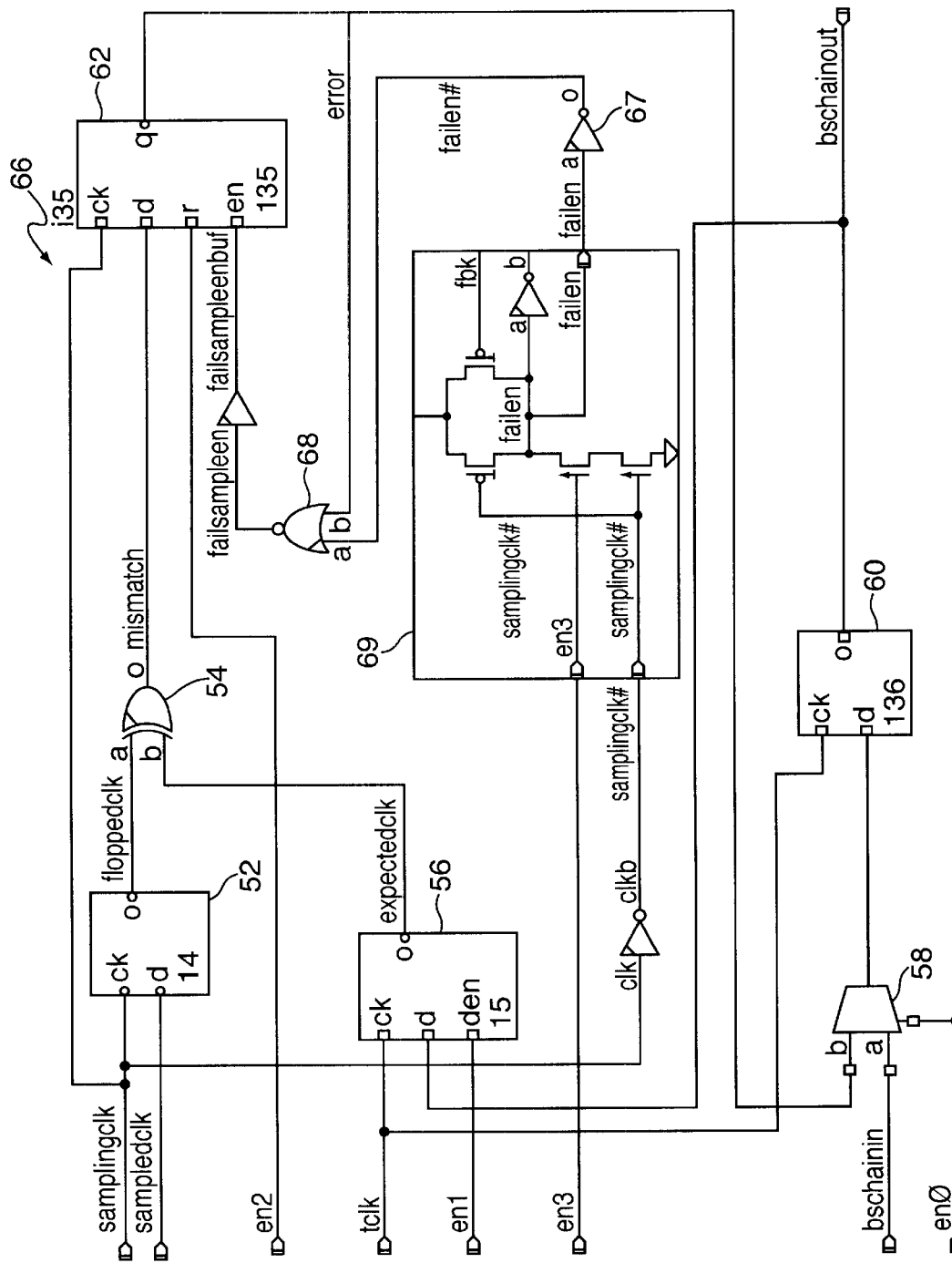
FIG. 4B is a circuit diagram of another failure calculation module in accordance with one embodiment of the present invention.

FIG. 4B is a circuit diagram of another failure calculation module 66 in accordance with one embodiment of the present invention. A fail enable driver circuit 66 provides a fail enable ("failen") signal that is used in enabling flip-flop 62, in this example. When the en3 signal is asserted (e.g., by going from a "1" value to a "0" value in this example), failen is set to a "1" on the rising edge of the samplingclk signal. The signal is then inverted by inverter 67 and NOR gate 68, and supplied to the enable input of flip-flop 62. Thus, flip-flop 62 is enabled when en3 is asserted and the sampling clock is at a "1" level, effectively preventing flip-flop 62 from outputting an incorrect fail signal.

According to an embodiment of the present invention, the stability of the failen signal is controlled by the circuit of block 66. During the transition of en3 (either from "1" to "0" or from "0" to "1"), a p-channel FET in block 69 (receiving the fbk signal) works to pull the failen value up to a "1" value or pull it down to a "0" value so as to maintain a crisp transition between 0 and 1 during what may be an unstable transition of the en3 signal between these values.

In this embodiment, the enable signals, en0–en3, are generated via the Test Access Port (TAP, see the above-cited IEEE 11459.1 specification). To that end, when a controller coupled to the TAP seeks to shift the scan chain, the input signal can be used to drive the en0 signal from a "1" value to a "0" value. Through on-chip circuitry, this transition in the en0 signal causes the en1 signal to go from "1" to "0" during the next rising edge of the tclk. This, in turn, causes the change of the value for en2 and en3. As seen in the timing diagram of FIG. 5 below, these enable signals are then pulled up to a "1" value at approximately the same time. There are numerous circuits available to generate enable signals in such a fashion, the selection of which is considered well-known in the art.

Figure 5:
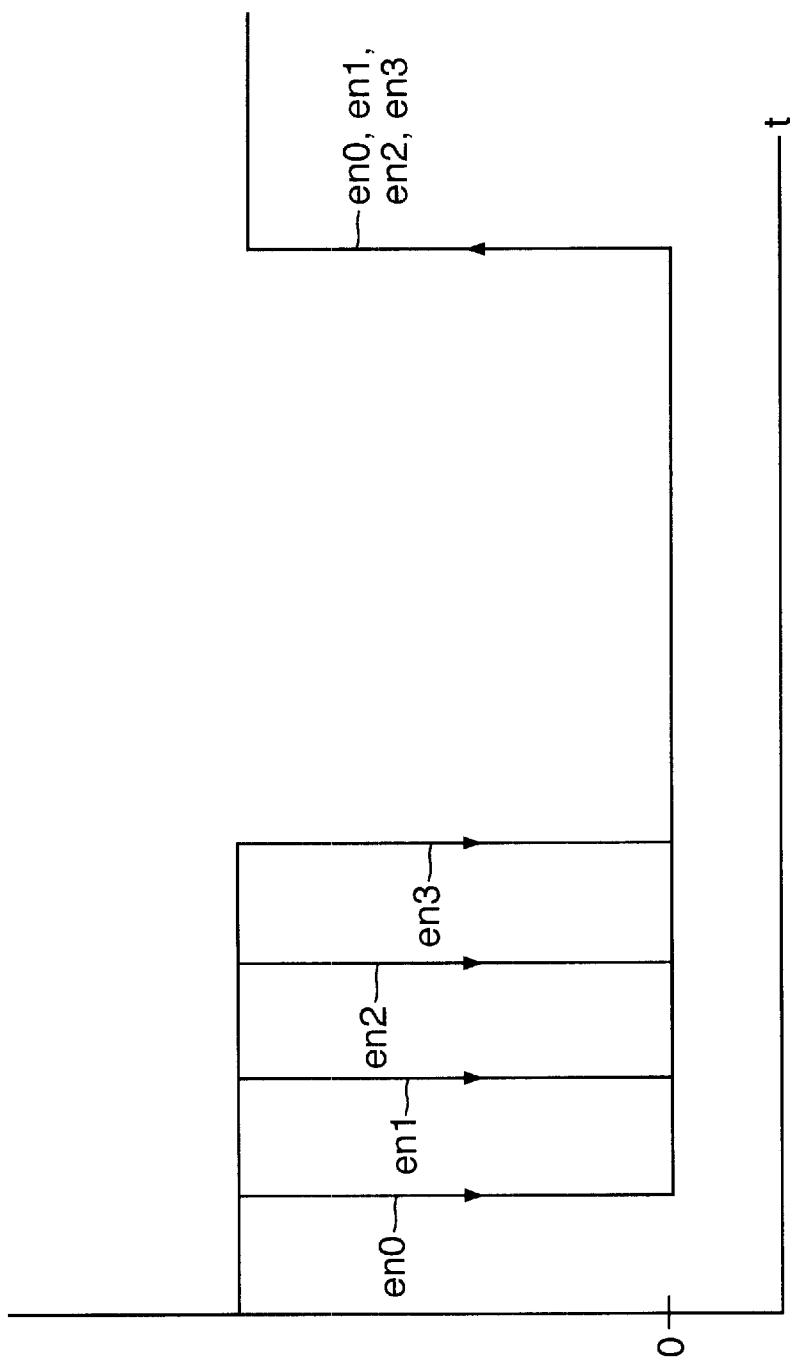
FIG. 5 is a timing diagram of the enable signals in accordance with one embodiment of the present invention.

FIG. 5 is a timing diagram of the enable signals in accordance with one embodiment of the present invention. All enable signals (en0, en1, en2, and en3) are asserted at the beginning of the testing period. As time passes, en0, en1, en2, and en3 become unasserted in sequence. The falling edges of each enable signal are preferably occurring with sequential tclk flops. Each enable signal provides stability to a certain part of the system when they are unasserted as described herein.

At the beginning of the timing diagram, all enable signals are asserted. Therefore, en0 selects the expected value data to be output from multiplexer 58 from the boundary scan chain. Before en0 is unasserted, the expected value is latched by flip-flop 60 on the rising edge of tclk. The expected value is then latched by flip-flop 56 to output expectedclk on the next rising edge of tclk when en1 is asserted. After en0 is unasserted, multiplexer 58 outputs data from the error signal. En1 is then unasserted to disable flip-flop 56 and stabilize the value of expectedclk.

When en2 is asserted, the value in flip-flop 62 is reset and the output of flip-flop 62 is always "0". When en2 is unasserted, flip-flop 62 resumes normal operation and latches mismatch on the rising edge of samplingclk. The enable signals ensure that the correct value is shifted out of both failure calculation modules 50 and 70 onto the boundary scan chain.

Figure 6:
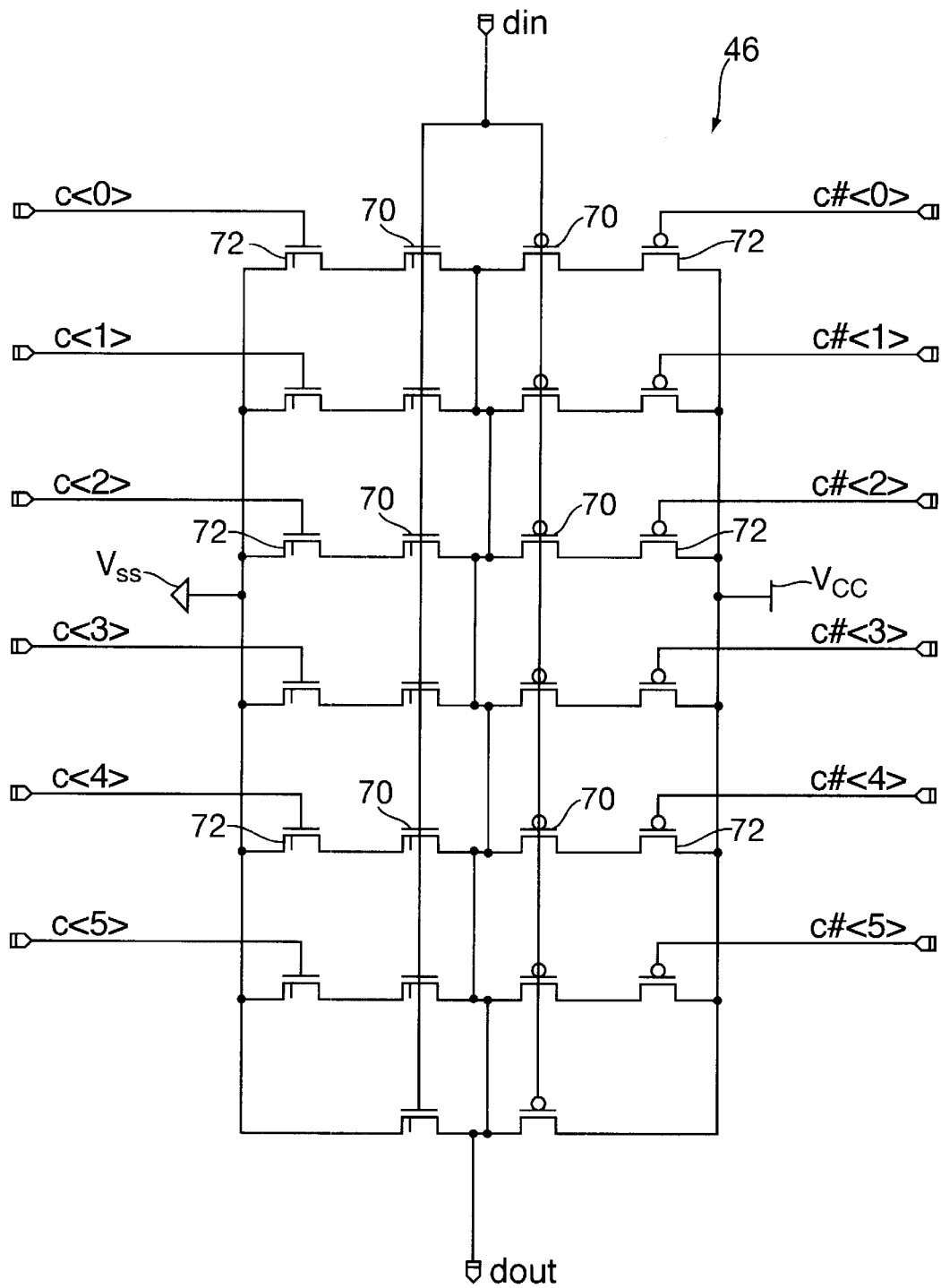
FIG. 6 is a circuit diagram of a programmable strength driver in accordance with one embodiment of the present invention.

FIG. 6 is a circuit diagram of programmable strength driver 46 in accordance with one embodiment of the present invention. Programmable strength driver 46 functions to add strength to a clock signal through a series of inverters. A clock signal is provided for programmable strength driver 46 at an input din. The signal is then supplied to a series of inner transistors 70 and a series of outer transistors 72. Outer transistors 72 may be turned on and off by asserting or unasserting signals r<0 . . . 5> and r#<0 . . . 5>.

Each signal r<0 . . . 5> and r#<0 . . . 5> is coupled to a pair of outer transistors 72 which drive the current with voltages $V_{cc}$ and $V_{ss}$, therefore allowing a wide range of strength to be added to the clock signal. Outer transistors 72 may be jointly operated to vary the current output by small increments. The signal is then output from programmable strength driver 46 at dout. Each inner transistor pair 70 inverts the clock signal, however the output dout is not inverted.

Figure 7:
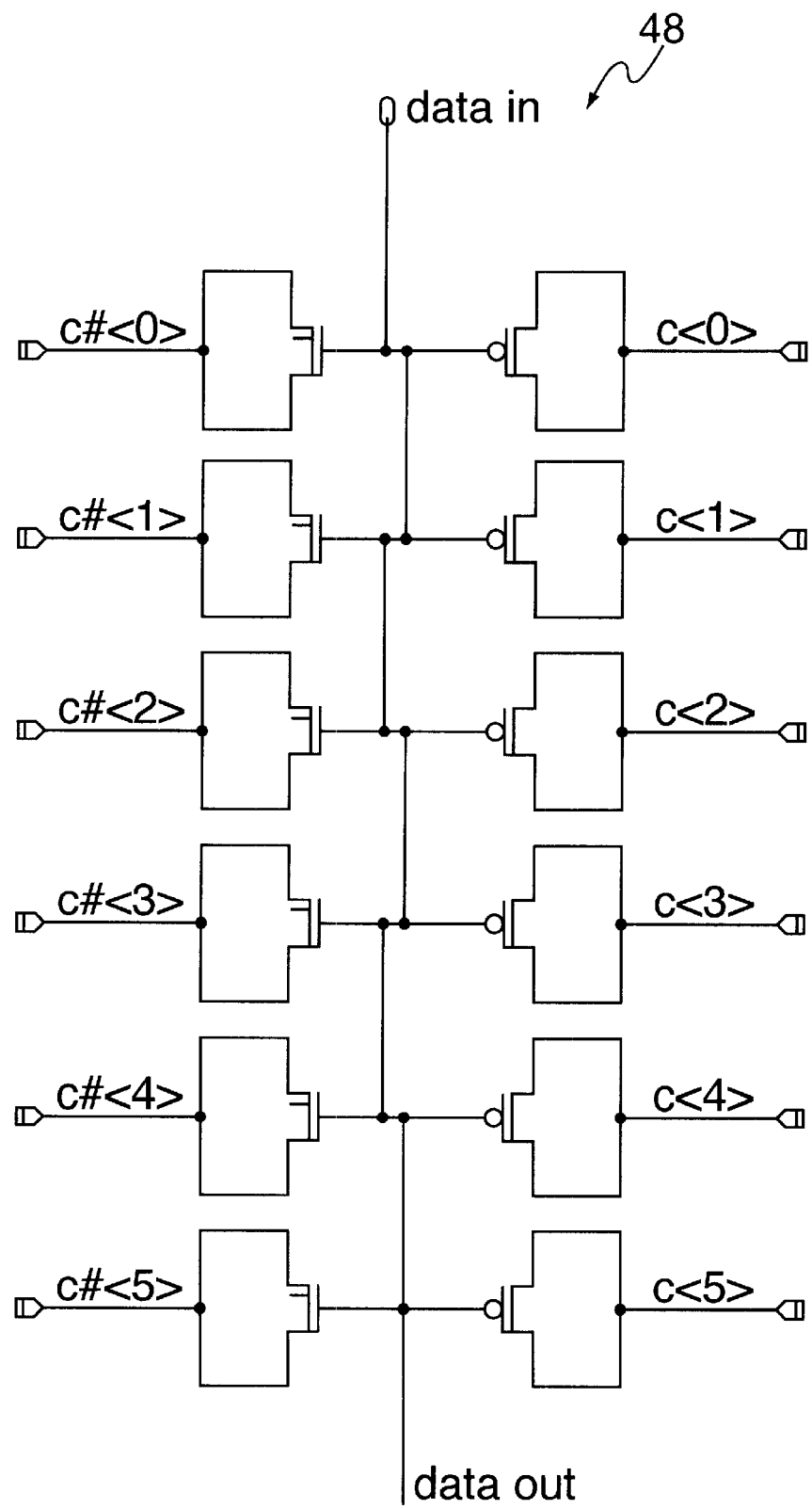
FIG. 7 is a circuit diagram of a programmable load capacitor in accordance with one embodiment of the present invention.

FIG. 7 is a circuit diagram of programmable load capacitor 48 in accordance with one embodiment of the present invention. A current is provided at an input data. The current is then supplied to a series of capacitors, which begin charging. The capacitors may be turned on and off by sending asserting or unasserting signals c<0 . . . 5> and c#<0 . . . 5>. When the capacitors are discharged, the output signal of the inverters will go to "1". Therefore, the falling edge of the clock signal will eventually cause a transition to high on the output.

The strength of the current input to programmable load capacitor 48 from programmable strength driver 46 determines how long it takes for the charging to happen. Each switch c<0 . . . 5> and c#<0 . . . 5> is coupled to a capacitor of different strength, therefore allowing for a wide and graded range of capacitance that must be charged before there is a discharge. The capacitors may be jointly operated to vary the delay by small increments, preferably with granularity control of down to 50 ps of delay in this example.

Figure 8:
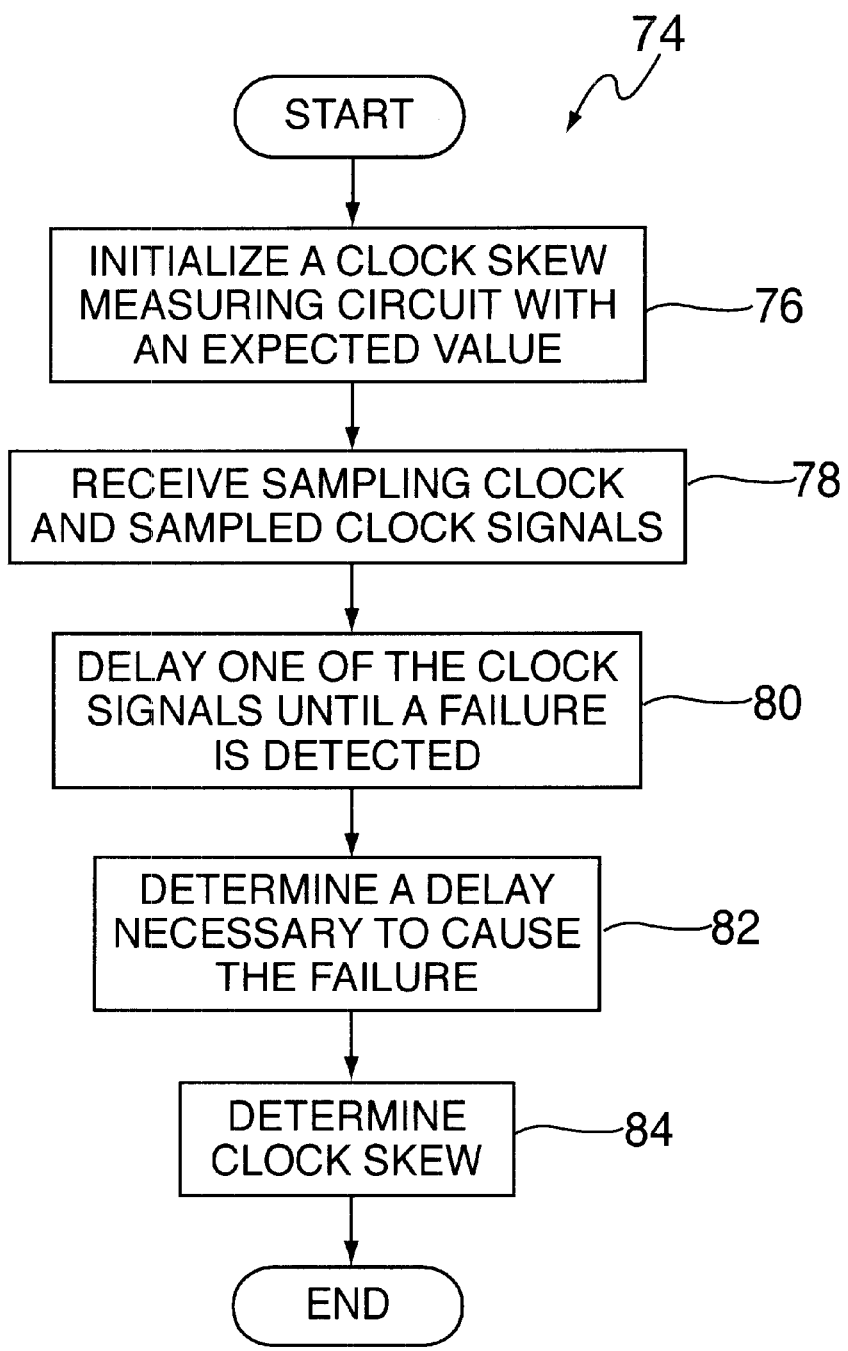
FIG. 8 is a flowchart of a method for measuring internal clock skew in an integrated circuit in accordance with one embodiment of the present invention.

FIG. 8 is a flowchart of a method 74 for measuring internal clock skew in an integrated circuit in accordance with one embodiment of the present invention. Method 74 begins at block 76, in which a clock skew measuring circuit is initialized with an expected value. The expected value is a value that is expected from the flopping of a sampled clock signal and a sampling clock signal if the chip is operating within the manufacturer's specification.

A sampled clock signal and a sampling clock signal are then received by a clock skew measuring circuit in block 78. One or both of the clock signals is then delayed in block 80 until a failure is detected between the sampled clock and the sampling clock. The clock signal is preferably delayed by a delay module that utilizes a programmable strength driver and a programmable load capacitor. The amount of delay added to each signal may be discovered through simulating the operation of the delay module. It is preferred that both clocks are coupled to a delay module to provide additional control over the clock signals. However, it will be understood by persons of skill in the art that other methods for delaying signals may be used to delay the clock signals.

The amount of delay necessary to cause a failure between the sampled clock signal and the sampling clock signal is determined by the settings of the delay modules when failure first occurs in block 82. A failure is detected by comparing the value of the sampled clock at the rising edge of the sampling clock with an expected value. The expected value is preferably input to the clock skew measuring circuit via a boundary chain scan. The failure is also preferably output to the boundary chain scan. The clock skew between the two clocks may then be determined in block 84 by comparing the delay necessary to cause failure and a duration of the signal level of the sampled clock signal.

An advantage of some embodiments of the present invention is that it allows internal clock skew to be measured through self-test circuitry, such as a boundary scan chain, therefore eliminating the significant additional cost associated with using a production tester. Because a production tester is not used, the present invention may reduce the time required to test the chip, particularly because it may also be used during silicon debug. Furthermore, the present invention reduces the number of tester pins required to test the chip, which is important because tester pins are limited in number.

It will therefore be appreciated that the present invention provides a method and apparatus for searlessly measuring clock skew in an integrated circuit. Other embodiments of the invention will be appreciated by those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. An integrated circuit to measure internal clock skew comprising:
    a first controlled delay module, wherein said first controlled delay module is to receive one of a sampling clock signal and a sampled clock signal; and
    a first flip-flop having a first input coupled to said first controlled delay module and a second input coupled to one of said sampling clock signal and said sampled clock signal, wherein said first flip-flop is to generate a flopped clock signal based on skew between said sampled clock signal and said sampling clock signal.

2. An integrated circuit as recited in claim 1, further comprising an XOR gate having an input coupled to the first flip-flop, wherein said XOR gate is to receive the flopped clock signal and an expected clock signal to generate a mismatch signal.

3. An integrated circuit as recited in claim 2, further comprising a second flip-flop having an output coupled to the XOR gate, a clock input to receive a test clock, and an input to receive an expected value signal, wherein said second flip-flop is to generate an expected clock signal.

4. An integrated circuit as recited in claim 3, further comprising a third flip-flop having an input coupled to the XOR gate and a clock input to receive the sampling clock signal, wherein said third flip-flop is to generate an error signal.

5. An integrated circuit as recited in claim 4, further comprising a fourth flip-flop having an output coupled to the second flip-flop, a clock input to receive the test clock signal, and an input to receive an expected value signal from a boundary scan chain, wherein said fourth flip-flop is to generate an expected value signal.

6. An integrated circuit as recited in claim 5, further comprising a multiplexer having a first input coupled to the boundary scan chain and a second input coupled to the third flip-flop, wherein said multiplexer is to select one of said first input and said second input as an output to the fourth flip-flop.

7. An integrated circuit as recited in claim 6, further comprising a NOR gate having an input coupled to the third flip-flop, wherein said NOR gate is to generate a fail sample enable signal.

8. An integrated circuit as recited in claim 7, further comprising a fail enable driver circuit to receive an inverted sampling clock signal, wherein said fail enable driver circuit is to generate a fail enable signal.

9. An integrated circuit as recited in claim 8, further comprising an inverter having an input coupled to the fail enable driver circuit and an output coupled to the NOR gate, wherein said inverter is to generate an inverted fail enable signal.

10. An integrated circuit as recited in claim 9, wherein the multiplexer includes a selector input to receive a first enable signal.

11. An integrated circuit as recited in claim 10, wherein the fourth flip-flop includes a data enable input to receive a first enable signal.

12. An integrated circuit as recited in claim 11, wherein the second flip-flop includes a data enable input to receive a second enable signal.

13. An integrated circuit as recited in claim 12, wherein the third flip-flop includes a reset input to receive a third enable signal.

14. An integrated circuit as recited in claim 13, wherein the fail enable driver circuit receives a fourth enable signal.

15. An integrated circuit as recited in claim 14, wherein the first, second, third, and fourth enable signals are deasserted in a sequence, wherein said sequence is determined to ensure that the expected value is input into the integrated circuit from the boundary scan chain and that the error signal is output to the boundary scan chain.

16. A method to measure internal clock skew in an integrated circuit comprising:
    receiving a sampled clock signal and a sampling clock signal; delaying one of said sampled clock signal and said sampling clock signal until a failure is detected;
    determining a delay necessary to cause said failure between said sampled clock signal and said sampling clock signal; and determining a clock skew by comparing said delay and a duration of a signal level of said sampled clock signal.

17. A method to measure internal clock skew in an integrated circuit as recited in claim 16, wherein detecting a failure includes flopping the sampled clock signal on a rising edge of the sampling clock signal to generate a flopped clock signal.

18. A method to measure internal clock skew in an integrated circuit as recited in claim 17, wherein detecting a failure further includes:

flopping an expected value with a rising edge of a test clock to generate an expected clock signal; and comparing said flopped clock signal with an expected clock signal to generate a mismatch signal.

19. A method to measure internal clock skew in an integrated circuit as recited in claim 18, wherein the expected value originates from a boundary scan chain.

20. A method to measure internal clock skew in an integrated circuit as recited in claim 19, wherein detecting a failure further includes flopping the mismatch signal on the rising edge of the sampling clock signal to generate an error signal.

21. A method to measure internal clock skew in an integrated circuit as recited in claim 20, wherein detecting a failure further includes selecting the error signal to be output to the boundary scan chain.

22. A method to measure internal clock skew in an integrated circuit as recited in claim 16, wherein delaying one of the sampled clock signal and the sampling clock signal includes:

increasing a current of the clock signal through a strength driver; charging a capacitor, wherein said capacitor is charged at a rate proportional to a value of the current; and discharging the capacitor.

23. An integrated circuit to measure internal clock skew comprising:

a first controlled delay module, wherein said first controlled delay module is to receive a sampling clock signal; and a first flip-flop having a clock input coupled to said first controlled delay module and an input coupled to a sampled clock signal, wherein said first flip-flop is to generate a flopped clock signal based on skew between said sampled clock signal and said sampling clock signal.

24. An integrated circuit as recited in claim 23, further comprising an XOR gate having an input coupled to the first flip-flop, wherein said XOR gate is to receive the flopped clock signal and an expected clock signal to generate a mismatch signal.

25. An integrated circuit as recited in claim 24, further comprising a second flip-flop having an output coupled to the XOR gate, a clock input to receive a test clock, and an input to receive an expected value signal, wherein said second flip-flop is to generate an expected clock signal.

26. An integrated circuit as recited in claim 25, further comprising a third flip-flop having an input coupled to the XOR gate and a clock input to receive the sampling clock signal, wherein said third flip-flop is to generate an error signal.

27. An integrated circuit as recited in claim 26, further comprising a fourth flip-flop having an output coupled to the second flip-flop, a clock input to receive the test clock signal, and an input to receive an expected value signal from a boundary scan chain, wherein said fourth flip-flop is to generate an expected value signal.

28. An integrated circuit as recited in claim 27, further comprising a multiplexer having a first input coupled to the boundary scan chain and a second input coupled to the third flip-flop, wherein said multiplexer is to select one of said first input and said second input as an output to the fourth flip-flop.

29. An integrated circuit as recited in claim 28, further comprising a NOR gate having an input coupled to the third flip-flop, wherein said NOR gate is to generate a fail sample enable signal.

30. An integrated circuit as recited in claim 29, further comprising a fail enable driver circuit to receive an inverted sampling clock signal, wherein said fail enable driver circuit is to generate a fail enable signal.

31. An integrated circuit as recited in claim 30, further comprising an inverter having an input coupled to the fail enable driver circuit and an output coupled to the NOR gate, wherein said inverter is to generate an inverted fail enable signal.

32. An integrated circuit as recited in claim 25, further comprising a second controlled delay module coupled between the sampled clock signal and the input of the first flip flop.

33. An integrated circuit as recited in claim 32, wherein the first and second controlled delay modules include:

a programmable strength driver; and a programmable load capacitor.

* * * * *